United States Patent
Hahn et al.

(10) Patent No.: US 9,356,180 B2
(45) Date of Patent: May 31, 2016

(54) PROCESS FOR ENCAPSULATING A SOLAR CELL IN A POLYMER MATRIX

(71) Applicant: SolarWorld Innovations GmbH, Freiberg (DE)

(72) Inventors: Harald Hahn, Dresden (DE); Matthias Georgi, Dresden (DE)

(73) Assignee: SOLARWORLD INNOVATIONS GMBH, Freiberg (DE)

( * ) Notice: Subject to any disclaimer, the term of this patent is extended or adjusted under 35 U.S.C. 154(b) by 226 days.

(21) Appl. No.: 13/781,787

(22) Filed: Mar. 1, 2013

(65) Prior Publication Data

US 2013/0243939 A1    Sep. 19, 2013

(30) Foreign Application Priority Data

Mar. 1, 2012    (DE) .......................... 10 2012 101 710

(51) Int. Cl.
| | |
|---|---|
| *H01L 31/18* | (2006.01) |
| *H01L 31/048* | (2014.01) |
| *C08L 75/04* | (2006.01) |

(52) U.S. Cl.
CPC ................ *H01L 31/18* (2013.01); *C08L 75/04* (2013.01); *H01L 31/048* (2013.01); *H01L 31/1876* (2013.01); *Y02E 10/50* (2013.01); *Y02P 70/521* (2015.11)

(58) Field of Classification Search
CPC ...................................................... H01L 31/18
USPC ............................................ 156/325; 427/74
See application file for complete search history.

(56) References Cited

U.S. PATENT DOCUMENTS

| | | |
|---|---|---|
| 3,699,072 A | 10/1972 | Clark |
| 3,892,707 A | 7/1975 | Itoh et al. |
| 4,056,405 A | 11/1977 | Varadi |
| 4,077,943 A | 3/1978 | Sato et al. |
| 4,082,726 A | 4/1978 | Mine et al. |
| 4,087,585 A | 5/1978 | Schulz |
| 4,093,473 A | 6/1978 | Lindmayer |

(Continued)

FOREIGN PATENT DOCUMENTS

| | | |
|---|---|---|
| CN | 1706049 A1 | 12/2005 |
| CN | 102007603 A | 4/2011 |

(Continued)

OTHER PUBLICATIONS

H. Cochrane et al. "The effect of fumed silica in RTV-1 silicone rubber sealants", Rubber World 192 (5), Aug. 1985, pp. 29-36.

(Continued)

*Primary Examiner* — Daniel Lee
(74) *Attorney, Agent, or Firm* — Viering, Jentschura & Partner mbB

(57) ABSTRACT

The present invention relates to a process for producing a solar module comprising one or more solar cell(s) encapsulated in a polymer matrix, wherein the process comprises applying a matrix composition to one or more solar cell(s) such that the one or more solar cell(s) is/are surrounded by a continuous layer of matrix composition and polymerizing the matrix composition in order to form a polymer matrix encapsulating the one or more solar cell(s), wherein the matrix composition is a structurally viscous liquid which comprises a polymerizable compound for forming the matrix and has a yield point, and to the thus obtainable solar modules.

25 Claims, 5 Drawing Sheets

(56) References Cited

U.S. PATENT DOCUMENTS

| | | |
|---|---|---|
| 4,143,949 A | 3/1979 | Chen |
| 4,167,644 A | 9/1979 | Kurth et al. |
| 4,245,079 A | 1/1981 | Matsumoto et al. |
| 4,257,936 A | 3/1981 | Matsumoto et al. |
| 4,677,161 A | 6/1987 | Suzuki et al. |
| 4,701,503 A | 10/1987 | Sato |
| 4,721,764 A | 1/1988 | Fujiki et al. |
| 4,912,188 A | 3/1990 | Colas et al. |
| 5,051,467 A | 9/1991 | Okinoshima et al. |
| 5,106,933 A | 4/1992 | Kobayashi et al. |
| 5,312,855 A | 5/1994 | Okami |
| 5,364,921 A | 11/1994 | Gray et al. |
| 5,438,094 A | 8/1995 | Fujiki et al. |
| 5,478,402 A | 12/1995 | Hanoka |
| 5,516,823 A | 5/1996 | Gentle et al. |
| 5,536,803 A | 7/1996 | Fujiki et al. |
| 6,743,515 B1 | 6/2004 | Mueller et al. |
| 7,119,159 B2 | 10/2006 | Fehn et al. |
| 7,288,322 B2 | 10/2007 | Bosshammer |
| 2003/0127452 A1* | 7/2003 | Gerhardinger ........ A47F 3/0434 219/497 |
| 2005/0228128 A1* | 10/2005 | Kotani .................. C08F 8/42 524/862 |
| 2008/0003492 A1* | 1/2008 | Bates .................. H01M 2/0207 429/66 |
| 2008/0084657 A1* | 4/2008 | Baba ...................... G04G 17/08 361/679.01 |
| 2011/0030791 A1 | 2/2011 | Snowwhite et al. |
| 2011/0036390 A1 | 2/2011 | Nelson et al. |
| 2011/0088777 A1 | 4/2011 | Becker et al. |
| 2011/0220203 A1 | 9/2011 | Takegami |
| 2012/0055105 A1 | 3/2012 | Kohl et al. |
| 2012/0186631 A1* | 7/2012 | Terreau et al. ................ 136/251 |
| 2013/0008491 A1 | 1/2013 | Rhein et al. |

FOREIGN PATENT DOCUMENTS

| | | |
|---|---|---|
| CN | 102190868 A | 9/2011 |
| DE | 102008012286 A1 | 9/2009 |
| DE | 102008027000 A1 | 12/2009 |
| DE | 102008041278 A1 | 2/2010 |
| DE | 102009026679 A1 | 12/2010 |
| DE | 202010005555 U1 | 11/2011 |
| DE | 102010030074 A1 | 12/2011 |
| FR | 2922363 A1 | 4/2009 |
| WO | 2005006451 A1 | 1/2005 |
| WO | 2008103227 A1 | 8/2008 |
| WO | 2009050146 A2 | 4/2009 |
| WO | 2009114189 A2 | 9/2009 |
| WO | 2009114190 A2 | 9/2009 |
| WO | 2011107592 A1 | 9/2011 |

OTHER PUBLICATIONS

English abstract of DE 10 2008 012 286 A1 dated Sep. 24, 2009.
English language abstract of DE 10 2008 027 000 A1 dated Dec. 17, 2009.
English language abstract of DE 20 2010 005 555 U1 dated Oct. 5, 2011.
Chinese Office Action based on Application No. 201310219069.9 (7 Pages) dated Jul. 1, 2015 (Reference Purpose Only).
Chinese Office Action based on Application No. 201310219069.9 (8 pages) dated Feb. 25, 2016 (Reference Purpose Only).

* cited by examiner

A

B

PROCESS FOR ENCAPSULATING A SOLAR CELL IN A POLYMER MATRIX

CROSS-REFERENCE TO RELATED APPLICATION

This Application claims priority to German Patent Application Serial No. 10 2012 101 710.7, which was filed on Mar. 1, 2012, and is incorporated herein by reference in its entirety.

FIELD OF THE INVENTION

The present invention relates to a process for encapsulating one or more solar cell(s) in a polymer matrix, wherein the matrix composition used is a structurally viscous liquid which comprises a polymerizable compound for forming the matrix and has a yield point, and to the thus obtainable solar modules.

BACKGROUND

The solar cells present in conventional solar modules are typically embedded in a polymer material in order to protect them from environmental influences. The embedded solar cells are usually disposed between an upper glass layer and a backside layer, consisting of glass (double glass modules) or of a sealing film (glass-film modules). The material for embedding the solar cells is typically ethylene-vinyl acetate (EVA), which is used in the form of a film. Overall, customary polymers used for embedding of solar cells (EVA, PVB, polyolefins) have only low UV stability and have to be protected from the harmful effects of UV radiation by means of UV absorber substances. As a result, however, some of the light (up to 3%) is lost unutilized. More particularly, for novel cell concepts such as selective emitter cells, it is essential to be able to better exploit this component of light than is possible with conventional embedding materials.

There exist only a few inherently UV-stable polymers which do not need these protective absorbers. One example of such inherently UV-stable polymers are silicones. Three-dimensionally crosslinked silicone elastomers additionally have very good thermomechanical properties which make them suitable for the encapsulation of solar cells. For instance, the glass transition point is below −40° C. and they generally exhibit a small change in the mechanical properties with temperature.

However, these materials can be processed only in liquid form, more particularly as addition-crosslinking 2-component materials (liquid encapsulation). This involves bonding the two components, by means of an added catalyst, permanently to give a rubber-elastic polymer. The necessity of processing these materials in liquid form, however, complicates the use thereof in solar module construction, especially for mass production. A known liquid encapsulation process with liquid silicone is performed with an exceptionally slow-curing 2K system, by securing the cell matrix vertically between two glass plates, sealing the edges of the layup and slowly introducing the silicone from the bottom. However, this process is unsuitable for automated mass production with high throughput.

Other processes make use of horizontal encapsulation techniques, but these are problematic particularly with regard to the demands on the encapsulation material used. For example, DE 20 2010 005555 U1 describes a solar module and a production apparatus, wherein the solar module is produced with a bonding material for embedding of solar-active elements, which replaces the conventional EVA films. The bonding material described may have a pasty or liquid consistency and be cured after embedding. Examples mentioned for a suitable bonding material are silicone or silicone-containing compounds. DE 20 2010 005555 U1, however, does not mention the disadvantages and difficulties associated with the use of such liquid or pasty materials, nor does it disclose strategies by which these can be overcome.

There is therefore still a need for improved liquid encapsulation processes which partially or completely overcome the known disadvantages.

SUMMARY OF THE INVENTION

In a first aspect, the present invention therefore relates to a process for encapsulating one or more solar cell(s) in a polymer matrix, said process comprising:
  (a) applying a matrix composition comprising at least one polymerizable compound to the surface of a first solid carrier material, the matrix composition being a structurally viscous liquid having a yield point;
  (b) placing the one or more solar cell(s) onto the matrix composition applied to the surface of the first carrier material;
  (c) applying the matrix composition to the surface of the solar cell;
  (d) placing a second solid carrier material onto the matrix composition applied to the surface of the solar cell;
  (e) pressing the structure composed of solar cell, matrix composition, and first and second carrier materials, such that the one or more solar cell(s) is/are surrounded by a continuous layer of matrix composition; and
  (f) polymerizing the matrix composition in order to form the polymer matrix.

The process can be used for production of a solar cell. The process can be used in automated form and in mass production.

In a further aspect, the invention relates to the use of a matrix composition which comprises at least one polymerizable compound and is in the form of a structurally viscous liquid having a yield point for encapsulation of a solar cell.

In yet a further aspect, the invention likewise relates to a solar module obtainable by the process according to the invention.

In yet another aspect, the invention relates to a solar module comprising
  (a) a first solid carrier material;
  (b) a second solid carrier material; and
  (c) one or more solar cell(s) encapsulated in a polymer matrix and arranged between the first carrier material and the second carrier material,
wherein the polymer matrix is produced by curing a matrix composition which comprises at least one polymerizable compound and is a structurally viscous liquid having a yield point.

Finally, the invention, in yet a further aspect, relates to a solar module comprising
  (a) a first solid carrier material;
  (b) a second solid carrier material;
  (c) one or more solar cell(s) encapsulated in a polymer matrix and arranged between the first carrier material and the second carrier material; and
  (d) one or more spacers formed from at least one first element and at least one second element joined to the first element, the first element engaging with an assembly formed from solar cell(s), polymer matrix, first carrier material and second carrier material so as to form a defined distance between first and second carrier materials, and the at least one second element being arranged such that it at least partly overlaps an outer edge of the assembly.

DETAILED DESCRIPTION OF THE INVENTION

Figure 1:
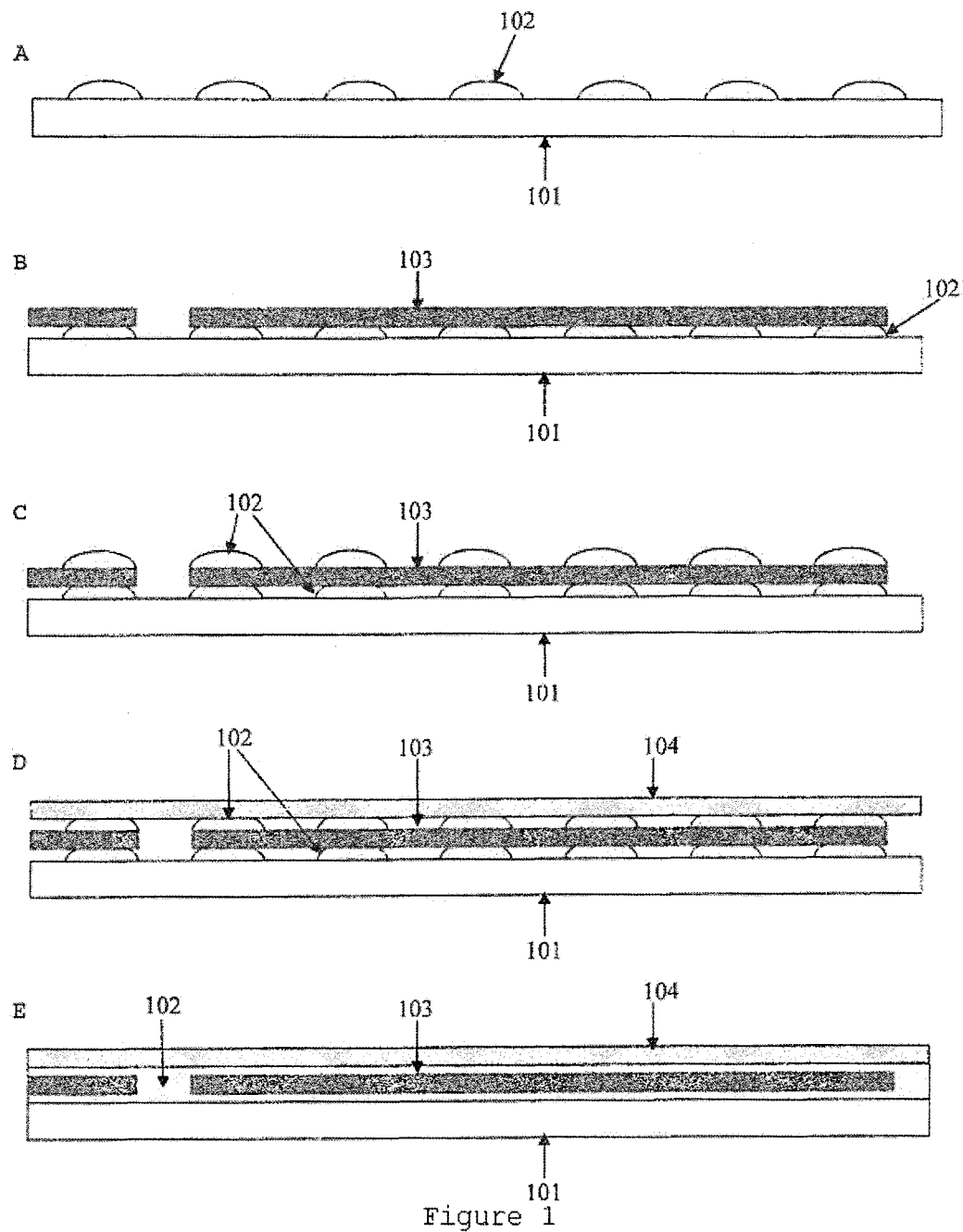
FIG. 1 shows a schematic of the cross section of the layup in the different phases of the process according to the invention. (A) Matrix composition (102) applied to a first carrier material (101). (B) First carrier material (101) and matrix composition (102) with solar cells (103) placed on. (C) First carrier material (101) and solar cells (103) with applied matrix composition (102). (D) First carrier material (101), matrix composition (102) and solar cells (103) with second solid carrier material (104) placed on. (B) The complete layup after pressing.

The present invention is based on the finding that the rheological properties of the base polymers used for embedding can be altered such that the problems which occur in the processing of medium-viscosity, free-flowing materials can be avoided.

In a first aspect, the present invention therefore relates to a process for encapsulating one or more solar cells) in a polymer matrix. This involves applying a matrix composition comprising at least one polymerizable compound to the surface of a first solid carrier material. The matrix composition from which the polymer matrix forms through polymerization is a liquid composition which is structurally viscous and has a yield point.

"Polymer matrix" as used herein relates to a solid material which comprises polymers and into which the solar cells are embedded. The polymer matrix material may be elastic or inelastic in the fully cured state.

"Structural viscosity", as used herein interchangeably with "pseudoplasticity" or "shear thinning", relates to the property of non-newtonian liquids that exhibit a decrease in viscosity with increasing shear force.

"Yield point" as used herein relates to the property of a liquid or dispersion to exhibit severe restriction of flow at low shear levels, which prevents flow, this restriction of flow only being eliminated under the action of a force exceeding the yield point.

In the process according to the invention, after the application of the matrix composition to a solid substrate, i.e. the first solid carrier material, for example a front glass, one or more solar cell(s) is/are placed onto the matrix composition. The placing-on is effected in such a way that there is at least some matrix composition between solar cell(s) and carrier material so that the solar cell(s) do(es) not come into direct contact with the carrier material.

In a next step, matrix composition is then applied to the surface of the solar cell, and then a second solid carrier material, for example a backside film or a backside glass, is placed onto the matrix composition. The placing-on is again effected in such a way that there is at least some matrix composition between solar cell(s) and second carrier material ao that there is no direct contact between solar cell(s) and carrier material.

The dimensions of the carrier materials are typically such that they project beyond the one or more solar cells on all sides and thus allow complete encapsulation of the solar cells.

After these steps have formed the layup consisting of first carrier material, matrix composition, solar cell(s), matrix composition and second carrier material, the layup structure is pressed. The pressing is effected in such a way that the matrix composition flows and forms a layer which surrounds the one or more solar cell(s) and is free of air inclusions. "Pressing" thus means herein that first and second carrier materials are pressed together, thus forming a continuous layer of matrix composition which encapsulates the solar cells. The pressure used in the pressing is selected such that the force applied to the matrix composition is above the yield point of the matrix composition and therefore leads to flow of the matrix composition. This makes it possible to form a polymer layer completely surrounding the solar cells.

The matrix composition can be cured in order to form the polymer matrix during any step in the process. For example, the polymerization may already be initiated with the production of the matrix composition. Such a procedure requires, depending on the time required for the complete polymerization, correspondingly rapid processing of the matrix composition. Alternatively, the polymerization can also be initiated during the pressing or thereafter. Curing may for example be effected by heating the layup structure.

An illustrative embodiment of the various steps of the process according to the invention is shown schematically in FIG. 1. FIG. 1A shows a schematic of a cross section through the first solid carrier substrate (101) after application of the matrix composition (102). The application can, as shown by way of example in FIG. 3, be effected in various patterns or shapes. Both the size and shape of the component area of the surface to which the composition is applied and the distance between and the arrangement of the component areas with matrix composition with respect to one another can be varied. The selection of suitable application forms and patterns can be made according to the process utilized for pressing. FIG. 1B shows a cross section through the layup after the solar cells (103) have been placed on. FIG. 1C shows a cross section through the layup after the matrix composition (102) has been applied to the solar cells (103). FIG. 1D shows a cross section through the layup after the second solid carrier material (104) has been placed on. FIG. 1E shows a cross section through the layup after pressing.

In various embodiments of the process according to the invention, the matrix composition comprises at least two, at least three or more polymerizable compounds.

"At least one", "at least two", "at least three" etc., as used herein, means, respectively, one or more, two or more and three or more, and includes 1, 2, 3, 4, 5, 6, 7, 8, 9, 10 or more.

The polymerizable compounds present in the matrix composition may be any known synthetic or natural polymerizable compound. The terms "polymerisable" and "curable" as well as "polymerize" and "cure" are used interchangeably herein. More particularly, these compounds may be monomers of the desired polymers or prepolymers. If prepolymers are involved, these may consist of one kind of monomer or of two or more different kinds of monomers. The polymers formed from the polymerizable compounds may be linear or branched polymers. The polymer in the polymer matrix may, for example, be one or more of the polymers from the group consisting of silicone rubbers, including fluorosilicones, polyurethanes, poly(meth)acrylates and epoxy resins, or mixtures thereof. Accordingly, the polymerizable compounds present in the matrix composition may be precursors of these polymers, for example silanes, siloxanes, silane-modified polymers, polyesters, polyurethane resins (polyols, polyisocyanates), especially aliphatic polyurethane resins, (meth) acrylates and epoxides. The polymer of the polymer matrix may likewise comprise copolymers and mixtures of the polymers mentioned.

In one embodiment of the invention, the at least one polymerizable compound is a 2-component silicone, preferably an addition-crosslinking 2-component silicone. In an addition-crosslinking 2-component silicone, both silicone polymers having free silane groups and silicone polymers having free vinyl groups are present, both kinds of silicone prepolymer having a relatively low viscosity, and these being freeflowing and pumpable. Both kinds of prepolymer react in an addition reaction in the presence of a noble metal catalyst to give the desired silicone rubber.

Suitable polymerizable compounds or compositions are, for example, the polyorganosiloxanes described in international patent publication WO 2011/107592. Further patent specifications which describe suitable polymerizable materials are U.S. Pat. No. 4,056,405, U.S. Pat. No. 4,093,473, U.S. Pat. No. 4,143,949, U.S. Pat. No. 4,167,644 and WO 2005/006451. Suitable addition-crosslinking polyorganosiloxanes are also described in U.S. Pat. No. 3,699,072, U.S. Pat. No. 3,892,707, U.S. Pat. No. 4,077,943, U.S. Pat. No. 4,082,726, U.S. Pat. No. 4,087,585, U.S. Pat. No. 4,245,079, U.S. Pat. No. 4,257,936, U.S. Pat. No. 4,677,161, U.S. Pat. No. 4,701,503, U.S. Pat. No. 4,721,764, U.S. Pat. No. 4,912,188, U.S. Pat. No. 5,051,467, U.S. Pat. No. 5,106,933, U.S. Pat. No. 5,312,855, U.S. Pat. No. 5,364,921, U.S. Pat. No. 5,438,094, U.S. Pat. No. 5,516,823, U.S. Pat. No. 5,536,803, U.S. Pat. No. 6,743,515, U.S. Pat. No. 7,119,159, U.S. Pat. No. 7,288,322, US20030236380, US20050089696 and WO2008103227.

If the matrix composition does not already have the desired structural viscosity and yield point by virtue of the selection of the polymerizable compound, this can be established by the addition of thickeners to the matrix composition. The thickeners are those suitable for production of structurally viscous liquids. In various embodiments of the invention, the matrix composition therefore comprises at least one thickener. This may be present in a concentration which makes the matrix composition structurally viscous and imparts a yield point thereto. The thickener may have a refractive index similar to that of the polymer of the polymer matrix. The refractive index may, for example, have a value within the range of ±25% of the refractive index of the polymer.

Figure 2:
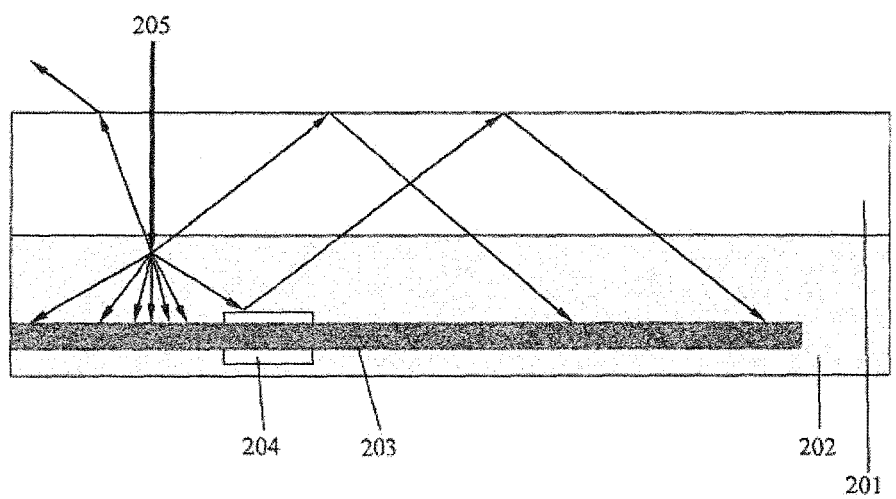
FIG. 2 shows a schematic of the scatter of incident light (205) at particles of the thickener in the matrix composition (202). Likewise shown are first carrier material (201), solar cells (203) and conductor tracks (204).

As shown schematically in FIG. 2, the thickener in the embedding material (202) can act as a light-scattering centre. However, this is uncritical to a certain degree since light scattering takes place principally in forward direction onto the solar cell (203), and the much smaller scattered light components in backward direction are additionally captured again to a certain degree by total reflection at the surface of the front material (201). An additional effect of the light scattering is that light falls at an oblique angle on reflective structures, for example cell connectors (204), and can then likewise be captured again. This effect generates additional module power and compensates for the losses caused by backward scattering.

In one embodiment of the invention, the thickener comprises fumed silica. Examples of suitable silicas are the silicas available under the Aerosil® brand name, including Aerosil 200 or Aerosil 300. The thickener particles preferably do not have a hydrophobic coating. The thickener is typically used in solid form, and the particles have mean diameters of 1 μm or less, preferably of about 200 nm. The particle size distribution is preferably essentially monodisperse.

In various embodiments of the invention, the matrix composition at room temperature (20° C.) and standard pressure (1000 mbar) has a dynamic zero viscosity $\eta_0$ of at least $10^3$ mPas, preferably at least $10^4$ mPas, even more preferably at least $10^5$ mPas, most preferably at least $10^6$ mPas.

The yield point $\tau_0$ of the matrix composition, in various embodiments of the invention, is at least 30 Pa, preferably at least 50 Pa, even more preferably at least 100 Pa, most preferably at least 150 Pa.

In the process according to the invention, the polymerization (curing) of the matrix composition can be effected by heating, UV irradiation, addition of a catalyst or polymerization initiator, or by mixing two compounds spontaneously polymerizable with one another. If the polymerization is effected by adding a catalyst or polymerization initiator to the matrix composition, this can be added to the matrix composition as early as prior to the application step, in order to initiate the polymerization. The process for encapsulation including the pressing is preferably already complete prior to complete polymerization. Alternatively, the polymerization can also be initiated by mixing two compounds spontaneously polymerizable with one another, optionally with an additional catalyst or polymerization initiator, in the matrix composition. This initiation of polymerization can likewise be performed prior to the application step. If a matrix composition with an already initiated polymerization reaction is used in the process according to the invention, the time which is required for complete polymerization or for a degree of polymerization which increases the viscosity to such an extent that the composition no longer has suitable rheological properties is such that processability of the composition in the process according to the invention is ensured. For example, the period for complete polymerization or for a degree of polymerization which increases the viscosity to such an extent that the composition no longer has rheological properties suitable for processing in the process, in various embodiments of the invention, may be up to 24 h, up to 18 h, up to 12 h, up to 6 h, up to 4 h, up to 3 h, up to 2 h, up to 1 h, preferably up to 30 minutes, up to 20 minutes, or up to 10 minutes, more preferably about 5 minutes.

If the polymerization is performed by means of heating or UV irradiation, the polymerization is preferably not initiated until the pressing step or thereafter. For example, the heating can be effected together with the pressing in a suitable laminator. If the polymerization is effected by heating, the initiation temperature is preferably at least 50° C., preferably at least 100° C.

In various embodiments of the invention, the first solid carrier material is a transparent front material. The material may be any front material customarily used, including but not limited to glass or polycarbonate.

The second solid carrier material may be a backside material. The backside material may, for example, be glass or a polymer film. The backside material need not be transparent. In various embodiments, the backside material is glass. The backside material may preferably be transparent to UV and/or light, and as a result allows the curing of the polymerizable compound through irradiation with UV or visible light through the backside layer.

In various embodiments, the second solid carrier material may have orifices which allow excess amounts of matrix composition to flow out in the course of pressing. The orifices may take the form, for example, of spots or strips.

Figure 3:
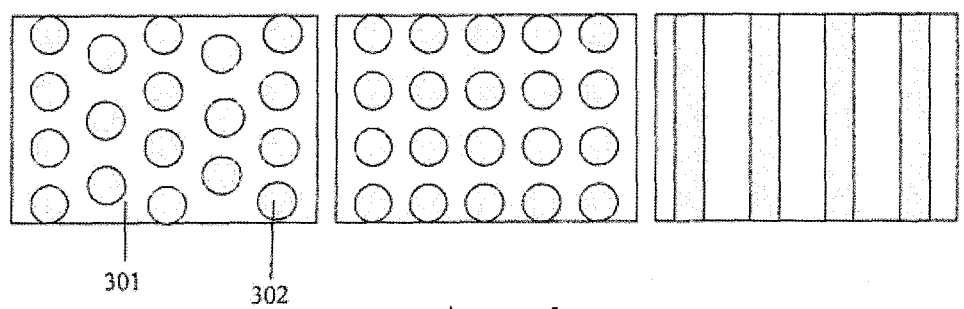
FIG. 3 shows a schematic of a top view of the first carrier material (301) with matrix composition applied in various forms/various patterns (302).

In order to ensure the formation of encapsulation free of air inclusions, the matrix composition is preferably applied locally to at least two spaced-apart component areas of the surface of the first solid carrier material and/or of the one or more solar cell(s). The application can be effected, for example, in the form of spots, strips or beads. Typically, the application is effected to at least five, at least 10, at least 20 or more component areas of the surface and/or of the solar cell. The amount applied is such that the pressing can form a continuous layer around the solar cells, such that the solar cells are in direct contact neither with one another nor with the carrier materials. Examples of application forms and patterns are shown in FIG. 3.

In various embodiments, the matrix composition is applied in such a way that air inclusions are avoided in the course of pressing. In other words, the application pattern of the matrix composition is selected according to the way in which the pressing is conducted such that the air present between carrier materials and solar cells can be removed and no air inclusions are formed.

In various embodiments, the process comprises an evacuation step. This step is intended to prevent the formation of air inclusions between carrier materials and solar cells, i.e. in the matrix composition. The evacuation is preferably performed prior to or in the course of pressing, i.e. at a time when the layup structure has been formed from solar cell, matrix composition, and first and second carrier materials. The evacuation can be effected, for example, by applying a vacuum.

Figure 4:
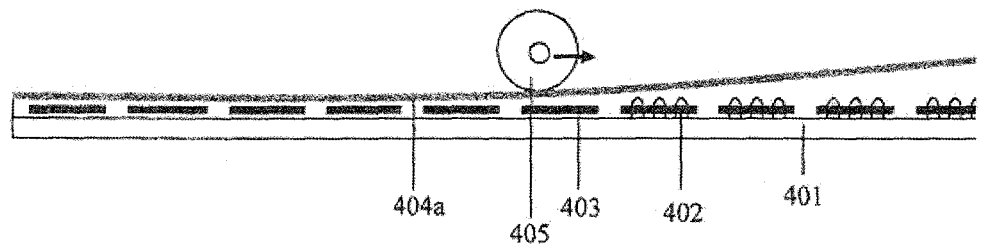
FIG. 4 shows a schematic of two alternative options for the pressing. (A) shows the pressing of the layup composed of first carrier material (401), matrix composition (402), solar cells (403) and backside film (404a) by means of a roller (405). (B) shows the pressing of the layup composed of first carrier material (401), matrix composition (402), solar cells (403) and backside glass (404b) by virtue of the weight of the backside glass itself.
Figure 4:
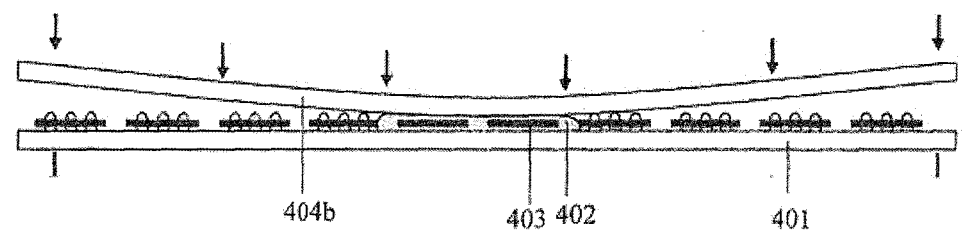

The pressing step can be effected in different ways commonly known in the prior art. More particularly, the pressing can be effected in a laminator, for example a laminator as typically used for production of solar modules. Alternatively, the layup can also be performed under a roller, preferably a flexible roller. If such a roller is used, the second carrier material is preferably a flexible backside film. Pressing with a roller is shown schematically in FIG. 4A. This involves pressing the layup composed of first carrier material (401), matrix composition (402) which has preferably been applied in bead form parallel to or at a sharp angle with respect to the roller axis, solar cells (403) and backside material (404) by means of a roller (405).

Finally, the pressing can also be effected by the placing-on of the second carrier material and through its own weight. In this case, the carrier material can be placed on in bent form, in such a way that it is first placed on centrally and then laid down toward the edges. The second carrier material here is preferably composed of glass. This principle is shown schematically in FIG. 4B. In this case, the backside material (404) in bent form is placed onto the layup composed of first carrier material (401), matrix composition (402) and solar cells (403), and the layup is pressed by the weight of the backside material itself.

Possibilities and apparatuses for pressing of the layup, especially in horizontal alignment, are disclosed, for example, also in the above-cited utility model specification DE 20 2010 005555 U1.

In the processes according to the invention, it is possible to use one or more spacers which engage with the layup composed of solar cells, matrix composition and carrier materials in such a way that a defined distance is maintained between first carrier material and second carrier material in the course of pressing. In various embodiments, the spacers are formed from at least one first element and at least one second element joined to the first element, the first element engaging with the layup and ensuring the distance between first and second carrier materials, and the second element being arranged such that it at least partly overlaps the outer edge of the layup.

In various embodiments, one spacer in each case may have a plurality of first elements spaced apart from one another and joined to a second element. The distance between the individual first elements may be from 1 mm up to 10 or more cm. The first elements may be of any desired shape, though they typically have an essentially rectangular cross section and the thickness thereof together with the compressibility thereof defines the distance between the first and second carrier materials. Suitable shapes are rectangular, triangular, semicircular and the like. The individual first elements joined to a single second element may independently be joined to the second element in such a way that they are either essentially vertical with respect thereto, meaning that the spacer has a T-shaped profile, or point alternately upward or downward in a plane, meaning that the first elements are arranged in a V-shaped cross section. In the latter case, the joint is preferably configured so as to be movable, such that the individual first elements are arranged essentially horizontally with respect to the carrier materials in one plane in the course of pressing. Illustrative arrangements are shown in the figures.

The spacers may also be configured so as to be compressible.

The first elements typically engage with the layup for about 1 mm up to 5 cm.

In various embodiments, the second element likewise has an essentially rectangular cross section. The width of thickness of the pressed layup may be the same or else lower. The length may be such that it corresponds to the length of an outer edge of the module. The thickness is typically a few mm to cm.

In various embodiments, the spacers may be part of an edge protection frame. This may simultaneously be adhesive-bonded to the embedding material in the curing step. Such an edge protection frame is advantageous especially in the case of solar modules in which both the frontside material and the backside material is glass. The advantages of using such an edge protection frame are protection against slippage of the layup in the course of pressing, and avoidance of excessive edge pressing or the escape of embedding material. The edge protection frame may encompass all edges of the solar module and consists typically of two or more parts. The edge protection frame may lie on and/or be adhesive-bonded to the edge, i.e. the cross-sectional face, of the layup.

The spacers form a defined distance between front- and backside material and thus prevent damage to the solar cell in the course of pressing. If they are integrated into an edge protection frame, the spacers may either be arranged in the module corners or over all or part of the frame length.

The edge protection frame/the spacers may consist of any suitable material. Suitable materials are known in the prior art and include, for example, aluminium, steel and polymers.

Figure 5:
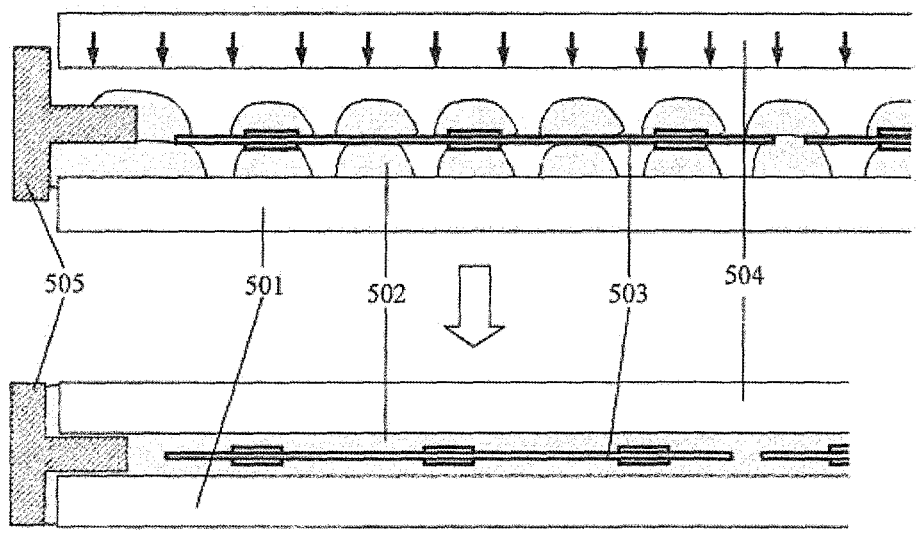
FIG. 5 shows a schematic of the cross section through the layup composed of first carrier material (501), matrix composition (502), solar cells (503), backside material (504) and edge protection frame (505) before and after pressing.

The use of an edge protection frame with a T-shaped profile in the region of the spacers is shown schematically in FIG. 5. FIG. 5 shows the cross section through the layup before and after pressing. This involves pressing the layup composed of first carrier material (501), matrix composition (502), solar cells (503), backside material (504) and edge protection frame (505).

Alternatively or additionally, the edges of the layup can be sealed with polymer, for example butyl rubber.

Figure 6:
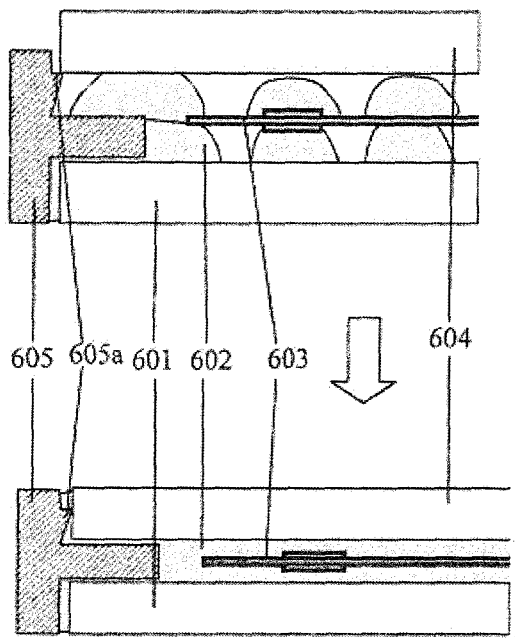
FIG. 6 shows a schematic of the cross section through the layup composed of first carrier material (601), matrix composition (602), solar cells (603), backside material (604) and edge protection frame (605) before and after pressing, the backside material (604) being placed on the latching elements (605a) of the edge protection frame (605) and then being moved over the latching position by the pressing.

The edge protection/spacer may additionally comprise latching elements which allow the positioning of the backside material prior to pressing. In the course of pressing, the backside material is then pressed over the latching position and the composite is produced. Such a principle is shown schematically in FIG. 6. FIG. 6 shows the cross section through the layup in the region of the spacers before and after pressing. The layup is produced from first carrier material (601), matrix composition (602), solar cells (603), backside material (604) and edge protection frame (605) in such a way that the backside material (604) is positioned on the latching elements (605a) of the edge protection frame (605) and is then moved over the latching position by the pressing.

Figure 7:
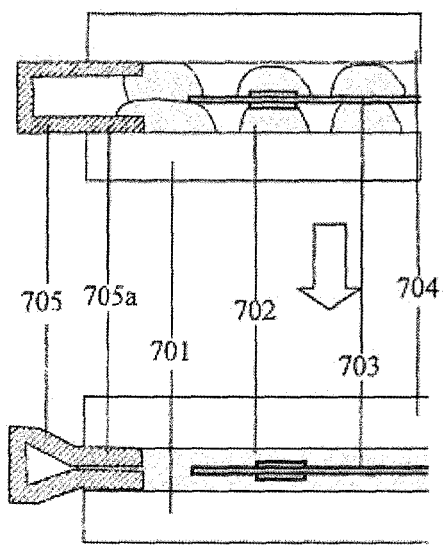
FIG. 7 shows a schematic of the cross section through the layup composed of first carrier material (701), matrix composition (702), solar cells (703), backside material (704) and spacers (705) before and after pressing. The spacers (705) shown have a U-shaped profile and are deformed in the course of pressing such that the two projections (705a) come into contact with one another.

As mentioned above, the spacers may be integrated in an edge protection frame or used separately therefrom. Such a use of separate spacers which can optionally be removed again is shown schematically in FIG. 7. FIG. 7 shows the cross section through the layup in the region of the spacers before and after pressing. The layup is formed from first carrier material (701), matrix composition (702), solar cells (703), backside material (704) and spacers (705), and then pressed. The spacers (705) shown have a U-shaped profile and are deformed in the course of pressing such that the two projections (705a) move toward or come into contact with one another. The resistance of the spacer prevents the layup from excessive compression and ensures a sufficient distance between front- and backside material (701, 704), which prevents damage to the solar cells (703).

Figure 8:
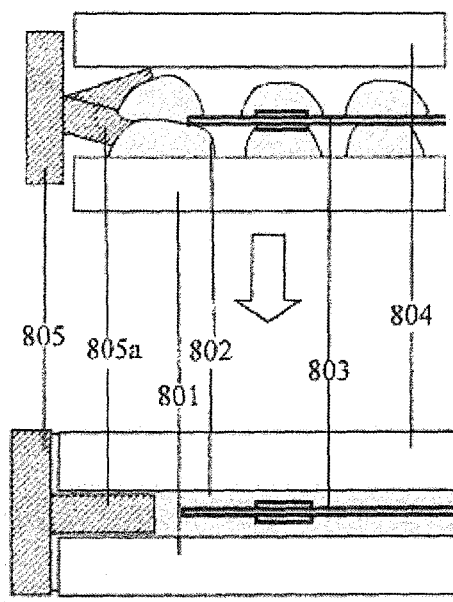
FIG. 8 shows (A) a schematic of the cross section through the layup composed of first carrier material (801), matrix composition (802), solar cells (803), backside material (804) and edge protection frame (805) with projections (805a) before and after pressing, and (B) a schematic of various suitable projection forms in top view.
Figure 8:
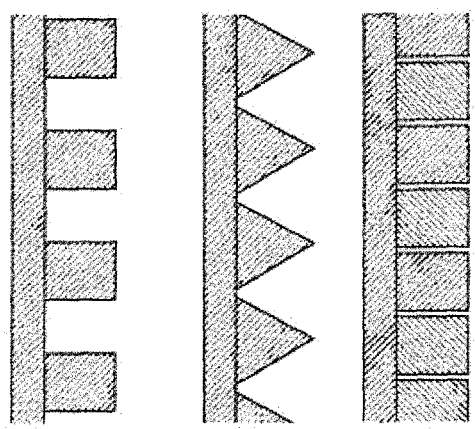

A further embodiment of spacers integrated into an edge protection frame is shown schematically in FIG. 8A. The edge protection frame has spaced-apart projections bent alternately upward and downward, which engage with the layup and are also pressed when the laminates are pressed on and prevent excessive edge pressing. FIG. 8A shows the cross section through the layup in the region of the spacers before and after pressing. The layup is produced from first carrier material (801), matrix composition (802), solar cells (803), backside material (804) and edge protection frame (805) with projections (805a), in such a way that, in the unpressed state, the projections of the edge protection frame (805a) bent alternately upward and downward ensure a distance between front (801) and backside material (804), which is reduced by the pressing in such a way that a composite is obtained. The projections may have various shapes. Examples of suitable shapes are shown schematically in top view in FIG. 8B.

The invention further relates to solar modules which are obtained by the processes according to the invention.

In yet another aspect, the invention is directed to a solar module comprising
  (a) a first solid carrier material;
  (b) a second solid carrier material; and
  (c) one or more solar cell(s) encapsulated in a polymer matrix and arranged between the first carrier material and the second carrier material,
wherein the polymer matrix is produced by curing a matrix composition which comprises at least one polymerizable compound and is a structurally viscous liquid having a yield point.

In one embodiment, the solar module further comprises one or more spacers as defined above. These may, as defined above, also be part of an edge protection frame.

Finally, the invention also covers solar modules comprising
  (a) a first solid carrier material;
  (b) a second solid carrier material;
  (c) one or more solar cell(s) encapsulated in a polymer matrix and arranged between the first carrier material and the second carrier material; and
  (d) one or more spacers formed from at least one first element and at least one second element joined to the first element, the first element engaging with an assembly formed from solar cell(s), polymer matrix, first carrier material and second carrier material so as to form a defined distance between first and second carrier materials, and the at least one second element being arranged such that it at least partly overlaps an outer edge of the assembly. The terms "carrier material" and "substrate" are used interchangeably herein.

In various embodiments, the spacers are as defined above and may also be part of an edge protection frame.

In the solar modules of the invention, carrier materials, solar cells and matrix may be defined as described above in connection with the processes according to the invention.

Further embodiments are present in the claims.

The invention is described herein by reference to particular embodiments but it is not restricted thereto. More particularly, it will be immediately apparent to the person skilled in the art that various changes can be made to the invention described without departing from the sense and scope of the invention as determined by the appended claims. The scope of the invention is thus determined by the claims, and the intention is that the invention covers all modifications and changes covered by the range of interpretation and equivalence of the claims.

What is claimed is:

1. Process for producing a solar module, said process comprising:
  (a) applying a matrix composition comprising at least one polymerizable compound in bead form to a surface of a first solid carrier material, the matrix composition being a structurally viscous liquid having a yield point,
    wherein the matrix composition comprises at least one thickener, and
    wherein the at least one thickener is present in a concentration which makes the matrix composition structurally viscous and imparts a yield point thereto;
  (b) placing one or more solar cell(s) onto the matrix composition applied to the surface of the first carrier material;

(c) applying the matrix composition to the surface of the one or more solar cell(s);

(d) placing a second solid carrier material onto the matrix composition applied to the surface of the one or more solar cell(s);

(e) pressing the structure composed of solar cell(s), matrix composition, and first and second carrier materials, wherein the pressing exceeds the yield point of the matrix composition to surround the one or more solar cell(s) with a continuous layer of matrix composition; and (f) polymerizing the matrix composition in order to form a polymer matrix encapsulating the one or more solar cell(s).

2. Process according to claim 1, wherein the matrix composition comprises at least two polymerizable compounds.

3. The process according to claim 1, wherein the at least one polymerizable compound is selected from the group consisting of silicones, silane-modified polymers, polyesters, polyurethane resins, (meth)acrylates and epoxides or copolymers and mixtures thereof.

4. The process according to claim 1, wherein the at least one polymerizable compound comprises addition-crosslinking 2-component silicones.

5. Process according to claim 1, wherein the matrix composition at room temperature (20° C.) and standard pressure (1000 mbar) has a dynamic zero viscosity $\eta_0$ of at least $10^4$ mPas.

6. Process according to claim 1, wherein the matrix composition has a yield point $\tau_0$ of at least 30 Pa.

7. Process according to claim 1, wherein the polymerization is effected by heating, UV irradiation, addition of a catalyst or polymerization initiator, or by mixing two compounds spontaneously polymerizable with one another.

8. Process according to claim 7, wherein the polymerization is initiated by adding a catalyst or polymerization initiator to the matrix composition prior to the application step or by mixing two compounds spontaneously polymerizable with one another in the matrix composition prior to the application step.

9. Process according to claim 1, wherein the first solid carrier material is glass.

10. Process according to claim 1, wherein the second solid carrier material is a polymer film or glass.

11. The process according to claim 1, wherein the process further comprises the step of evacuating the structure composed of solar cell, matrix composition, first and second carrier materials, in order to prevent air inclusions.

12. Process according to claim 1, wherein the pressing is effected in a laminator, by means of a roller or by virtue of the weight of the second carrier material itself.

13. Process according to claim 12,
wherein the beads are applied at least one of parallel to a longitudinal axis of the roller or at an acute angle with respect to a longitudinal axis of the roller and wherein pressing the structure with the matrix composition having the pattern of the beads removes air between the first and second carrier materials and the one or more solar cell(s), and avoids air inclusions.

14. Process according to claim 1, wherein the process further comprises the step of inserting one or more spacers with projections disposed between the first and second carrier materials, which are positioned such that a defined distance between the first and second carrier materials is maintained at least at the edge of the structure composed of solar cell, matrix composition, and first and second carrier materials.

15. Process according to claim 14, wherein the spacers are formed from at least one first element and at least one second element joined to the first element, the first element engaging with an assembly formed from solar cell(s), polymer matrix, first carrier material and second carrier material so as to form a defined distance between first and second carrier materials, and the second element being arranged such that it at least partly overlaps an outer edge of the assembly.

16. Process according to claim 14, wherein the spacers are integrated in an edge protection frame.

17. Process according to claim 1,
wherein the beads are applied in a pattern.

18. Process according to claim 1,
wherein the thickener comprises fumed silica.

19. Process according to claim 1,
wherein the thickener is configured to scatter light.

20. Process for producing a solar module, said process comprising:
applying a matrix composition comprising at least one polymerizable compound to a surface of a first solid carrier material, the matrix composition being a structurally viscous liquid having a yield point,
wherein the matrix composition comprises at least one thickener, and
wherein the at least one thickener is present in a concentration which makes the matrix composition structurally viscous and imparts a yield point thereto;
placing one or more solar cell(s) onto the matrix composition applied to the surface of the first carrier material;
applying the matrix composition to the surface of the one or more solar cell(s);
placing one or more spacers with projections disposed between the first and a second carrier material, such that a defined distance between the first and second carrier materials is maintained at least at the edge of the structure composed of solar cell, matrix composition, and first and second carrier materials
placing the second solid carrier material onto the matrix composition applied to the surface of the one or more solar cell(s);
pressing the structure composed of solar cell(s), matrix composition, and first and second carrier materials, wherein the pressing exceeds the yield point of the matrix composition to surround the one or more solar cell(s) with a continuous layer of matrix composition; and
polymerizing the matrix composition in order to form a polymer matrix encapsulating the one or more solar cell(s).

21. Process according to claim 20,
wherein the one or more spacers are formed from at least one first element and at least one second element joined to the first element, the first element engaging with an assembly formed from solar cell(s), polymer matrix, first carrier material and second carrier material so as to form a defined distance between first and second carrier materials, and the second element being arranged such that it at least partly overlaps an outer edge of the assembly.

22. Process according to claim 20,
wherein the one or more spacers further comprise at least one positional protruding element.

23. Process according to claim 22,
wherein the at least one positional protruding element aligns and holds a position of the second carrier material prior to pressing, and maintains the position of the second carrier material after pressing.

24. Process according to claim 20,
wherein the one or more spacers have a first geometry configured to provide a first defined distance between the first and second carrier materials prior to pressing, and wherein the first geometry is configured to transform into a second geometry to provide a second defined distance between the first and second carrier materials after pressing.

25. Process according to claim 24,
wherein the first defined distance is different from the second defined distance.

* * * * *